United States Patent
Schwenk et al.

Patent Number: 5,267,658
Date of Patent: Dec. 7, 1993

[54] FASTENING DEVICE

[75] Inventors: Hans M. Schwenk; Henning Wick, both of Straubenhardt, Fed. Rep. of Germany

[73] Assignee: Schroff GmbH, Straubenhardt, Fed. Rep. of Germany

[21] Appl. No.: 839,995

[22] Filed: Feb. 24, 1992

[30] Foreign Application Priority Data

Feb. 22, 1991 [DE] Fed. Rep. of Germany ....... 4105548

[51] Int. Cl.⁵ .............................................. A47F 7/00
[52] U.S. Cl. ..................................... 211/26; 361/796; 361/825; 211/41; 248/295.1
[58] Field of Search ........................... 211/41, 26, 162; 361/415; 206/328, 334; 248/295.1, 297.2, 225.1

[56] References Cited

U.S. PATENT DOCUMENTS

| | | |
|---|---|---|
| 4,754,944 | 7/1988 | Bovermann . |
| 4,911,393 | 3/1990 | Alperson ........................... 248/297.2 |
| 4,979,073 | 12/1990 | Husted ............................. 361/415 X |
| 5,008,778 | 4/1991 | Peyerl ................................. 361/415 |

FOREIGN PATENT DOCUMENTS

| | | |
|---|---|---|
| 0208260 | 1/1987 | European Pat. Off. . |
| 1129193 | 5/1962 | Fed. Rep. of Germany . |
| 2635439 | 2/1978 | Fed. Rep. of Germany . |
| 3620870 | 12/1987 | Fed. Rep. of Germany . |
| 8906492 | 9/1989 | Fed. Rep. of Germany . |
| 8601675 | 3/1986 | PCT Int'l Appl. . |

*Primary Examiner*—Blair M. Johnson
*Attorney, Agent, or Firm*—Spencer, Frank & Schneider

[57] ABSTRACT

The present invention relates to a fastening device for component carriers in system housings. Profiled fastening members are here fastened to the front frame bars of the system housings, each supporting two parallel arranged and oppositely oriented mounting strips. L-shaped mounting brackets provided with fastening threads can be pushed transversely into the mounting groove formed by the mounting strips. A spread-away spring element is fastened to the backs of the L-shaped mounting brackets. If the mounting angles are in the inserted installed position, a retaining lug engages in a longitudinal groove of the front mounting strip. The mounting brackets can be adjusted to any desired height. The front plate of the component carrier is screwed to four mounting brackets and, after the fastening screws are tightened, the component carrier is fastened at the desired height.

7 Claims, 1 Drawing Sheet

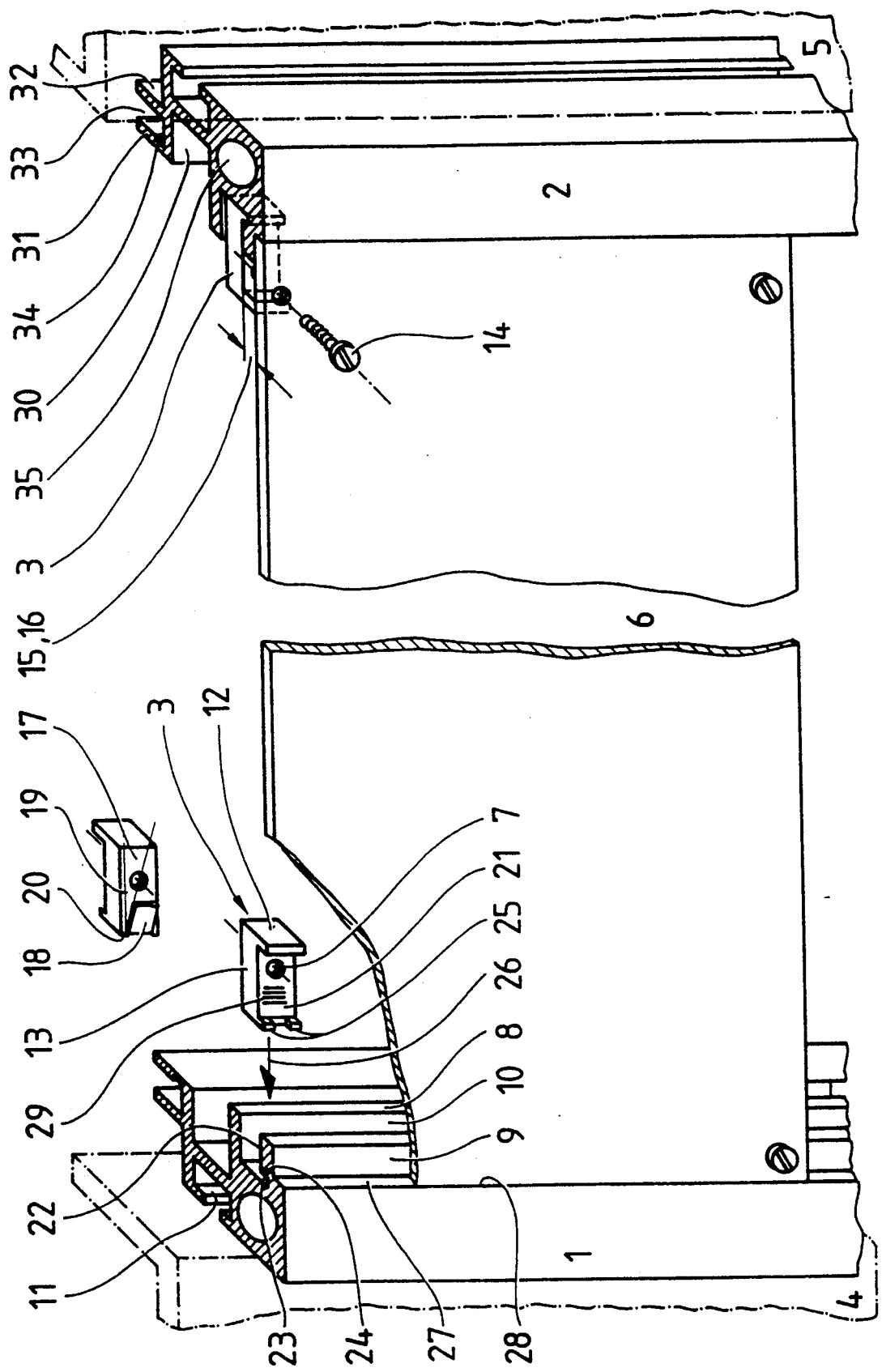

FASTENING DEVICE

CROSS REFERENCE TO RELATED APPLICATION

This application claims the priority of application Ser. No. P 41 05 548.9, filed Feb. 22, 1991, in the Federal Republic of Germany, the subject matter of which is incorporated herein by reference.

BACKGROUND OF THE INVENTION

The present invention relates to a fastening device for component carriers in system housings and includes profiled fastening members that can be attached to the two forward vertical frame bars of the system housings as well as carrier elements that are displaceable in height, can be fixed to the profiled fastening members and are provided with a fastening thread for screwing on the component carriers which are equipped with front plates.

Component carriers serve to accommodate component groups, that is printed circuit boards provided with front plates, which are equipped with electrical and electronic components. A plurality of component carriers are arranged vertically above one another in system housings. Such system housings are composed of a supporting frame structure which includes wall, bottom and cover members and has a front opening that can be closed by a door through which the component carriers and component groups are accessible.

It is known to attach a profiled fastening member to fasten the component carriers to each of the two vertical front frame bars of the system housings, with a number of height adjustable and fixable carrier elements being provided at each profiled fastening member. These carrier elements are provided with fastening threads by means of which the component carriers are screwed at the desired height to the profiled fastening members and thus to the system housing.

Profiled fastening members equipped with rows of holes permit in a simple manner the screwing on of the component carriers at discrete heights. This poses no problems whatsoever as long as the component groups and their front plates are standardized with respect to their height dimensions or fall into a uniform grouping. Difficulties arise if component groups of different standards ar to be installed in uniform system housings. This is possible only if the carrier elements are displaceable and can be fixed to the profiled fastening members at any desired height.

Profiled rails have already been proposed which permit the fixing of the displaceable carrier elements at any height. These profiled rails are provided with T-shaped grooves in which threaded nuts can be displaced. The nuts are secured against slipping by means of profiled rubber members that are seated in the T-shaped grooves (unexamined published German Patent Application DE 3,620,870). The drawback is here that all threaded nuts must be pushed into the T-shaped grooves from the frontal faces of the profiled rails, that is, before they are installed in the frame bars of the system housings.

Also known is the use of spring tensioned sliding nuts for use at a predetermined location in a T-shaped groove. With such spring tensioned sliding nuts, displaceable carrier elements can be fastened at any desired height to correspondingly configured profiled rails. The rear face of each spring tensioned sliding nut is provided with a spring device that is supported at the bottom of the T-shaped groove, and the T-shaped groove as well as the spring tensioned sliding nut are dimensioned in such a way that the latter can be introduced from the outside into the T-shaped groove and in its interior can be pivoted into a rotated use position (German Patent No. 2,635,439). However, the establishment of the use position and displacement of the spring tensioned sliding nut is not possible manually but requires a tool.

Additionally, a device is known for fastening component carriers to the vertical frame bars of switching panels in which profiled fastening members are connected with the frame bars, each profiled fastening member being provided with a connecting web. Threaded, U-shaped sliding members are engaged on the connecting webs; these sliding members are adjustable in height and surround the connecting webs in a resilient manner for the purpose of holding them (European Patent No. 0,208,260). The manufacture of this device necessitates a certain amount of expenditures because requirements must be met for accurate fit.

SUMMARY OF THE INVENTION

It is an object of the present invention to design a fastening device for component carriers in system housings which provide for infinite adjustability in height so that manual assembly and adjustments are possible and manufacture is conceivably simple.

To solve this problem, a fastening device for component carriers in system housings is used as the basis which includes profiled fastening members that can be attached to the two vertical front frame bars of the system housings and are provided with height adjustable carrier elements that can be fixed to the profiled fastening members. The carrier elements are provided with a fastening thread for screwing on the component carriers that are equipped with front plates.

The problem is further solved in that the profiled fastening members are each equipped with two parallel mounting strips, namely a rear mounting strip adjacent to the interior of the system housing and a front mounting strip near the opening of the system housing; the mounting strips form a mounting groove that has an essentially rectangular cross section; the mounting strips of the profiled fastening members face toward one another; the carrier elements are mounting brackets which have an L-shaped cross section including a short L-leg and a long L-leg; the short L-leg of the mounting bracket forms a contact strip for the front plate of the component carriers; the free length of the short L-leg coincides with the thickness of the front mounting strip; in addition to the fastening thread, the back of the mounting bracket supports a spread-away spring element; a longitudinal guide in the form of a longitudinal groove and at least one retaining lug engaging in it is formed between the frontal face of the mounting bracket and the interior face of the front mounting strip; and, if the spring element is depressed, the mounting bracket can be inserted from the side into the mounting groove between the two mounting strips, with the retaining lug, when in the mounted position, engaging in the longitudinal groove. The profiled fastening members as well as, in particular, the proposed L-shaped carrier elements are conceivably simple in configuration and use of the device requires no tools.

As an advantageous feature of the fastening device, the longitudinal groove is provided at the base of the front mounting strip and the retaining lug engaging in the longitudinal groove is shaped to the free end of the long L-leg of the mounting bracket. This produces favorable fastening conditions.

The front mounting strip may be provided with a contact shoulder for the vertical side edge of the front plate of the component carrier.

Advisably a leaf spring is employed as the spring element. If this spring is made of steel, it is able to generate high spring forces and is easy to manufacture.

Advantageously, the leaf spring is clamped and fastened at the free end of the long L-leg of the mounting bracket and extends in the direction toward the fastening thread.

As an additional fastening means for the component carriers, the profiled fastening members may be provided with two additional parallel mounting strips which likewise form a mounting groove that has a rectangular cross section, and the one mounting strip may again be provided with a longitudinal groove at its base for engagement in the retaining lug of a mounting bracket.

The manufacture of the profiled fastening members is simplified if the additional mounting strips are shaped to an L-shaped rail which is attached to the profiled fastening members in the region of the rear mounting strip.

BRIEF DESCRIPTION OF THE DRAWING

One embodiment of the invention will now be described in greater detail with reference to the attached perspective drawing. This drawing figure shows the fastening device in approximately its natural size. The profiled fastening members are cut off at the top, the front plate is cut out at one corner and somewhat above it a mounting bracket is shown with its rear face facing forward.

DETAILED DESCRIPTION OF THE PREFERRED EMBODIMENT

The fastening device according to the invention is composed of two profiled fastening members 1 and 2 and at least four mounting brackets 3.

The two profiled fastening members 1 and 2 which are drawn of aluminum are attached to the two vertical front frame bars 4 and 5 (indicated in dashed lines) of a non-illustrated system housing or frame structure (as disclosed, for example, in German Utility Model Patent No. 87/03,617). Such a system housing serves to accommodate superposed component carriers (not shown) for example according to German Utility Model Patent No. 90/13,093. A front plate 6 is provided at the frontal face of such a component carrier, behind which are seated component groups or printed circuit boards equipped with electrical and electronic components.

Mounting brackets 3 are carrier elements that are fixed to profiled fastening members 1 and 2 in a height adjustable manner and, in order to permit the component carriers or, more precisely, their front plates 6 to be screwed on, are each provided with a fastening thread 7. These carrier elements make it possible to fasten the component carriers in the system housing precisely at the desired height.

Profiled fastening members 1 and 2 are provided with two mutually parallel mounting strips that extend over their entire length, namely a rear mounting strip 8 adjacent the interior of the system housing as well as a front mounting strip 9 which lies near the opening of the system housing. The drawing therefore shows the rear mounting strips 8 at the rear, the front mounting strips 9 in front of them, with the view being directed through the opening into the interior of the system housing.

The rear mounting strip 8 and the front mounting strip 9 which are arranged next to one another at a distance from one another have the same height and have such a configuration that they form a rectangular—almost square—mounting groove 10. This mounting groove 10 could also have a slightly trapezoidal, inwardly widening or dovetailed cross section. The two profiled fastening members 1 and 2 are screwed to frame bars 4 and 5 which have an L-shaped cross section—a plurality of head screws and nuts are provided for this purpose, with the heads of the screws being pushed into T-shaped grooves 11 in profiled fastening members 1 and 2 and passing through holes provided for this purpose in frame bars 1 and 2.

The two mounting strips 8 and 9 of the one profiled fastening member 1 and of the other profiled fastening member 2 face toward one another and lie behind one another in two planes that are parallel to the opening of the system housing.

The mounting brackets 3 serving as carrier elements for the component carriers have an L-shaped cross section. Each mounting bracket 3 has a short, thin L-leg 12 and a thick, long L-leg 13. These mounting brackets 3 are made of steel (or also of a suitable plastic) and are sections of a corresponding profile. The long L-leg 13 is provided with the fastening thread 7 for fastening screws 14 with which the front plate 6 of the component carrier is fastened to profiled fastening members 1 and 2 with the use of mounting brackets 3.

The short L-leg 12 of the mounting bracket 3 forms a contact strip for front plate 6 against which the rear face of front plate 6 lies when the component carrier is installed. For this purpose, the free length 15 of the short L-leg 12 (in other words, the height clearance of the contact strip) coincides with the thickness 16 of the front mounting strip 9.

A spring element 18 is fastened to the back 17 of mounting bracket 3, namely to its long L-leg 13. The spring element is a leaf spring made of spring steel which is spread away at an angle 19 of about 30 angular degrees relative to the back 17. This spring element 18 in the form of the leaf spring is clamped in or otherwise fastened at one of its ends to the free end 20 of the long L-leg 13 and extends in the direction toward fastening thread 7. For a mounting bracket 3 made of plastic, the leaf spring is also made of plastic and is shaped to back 17; if it is suitably configured, it may also be clamped and engaged in mounting bracket 3.

Between the frontal face 21 of mounting bracket 3 and the interior face 22 of the front mounting strip 9, a longitudinal guide is formed. This longitudinal guide is composed, on the one hand, of a longitudinal groove 23 provided at the base 24 of the front mounting strip 9 and extending over the entire length of profiled fastening members 1 and 2. On the other hand, it is composed of two block-shaped retaining lugs 25 shaped to the free end of the long L-leg of mounting bracket 3. Longitudinal groove 23 and retaining lugs 25 have an approximately rectangular cross section, with retaining lugs 25 being configured to fit into longitudinal groove 23.

The dimensions of mounting bracket 3 are selected so that the latter, if spring element 18 (the leaf spring) is pressed down against the back 17, can be pushed from the side into the mounting groove 10 between the two mounting strips 8 and 9 in the direction of arrow 26.

The length 15 of the short L-leg 12 and the thickness of the long L-leg 13 together are dimensioned to be somewhat less than the inner clearance of mounting groove 10.

As soon as a mounting bracket 3 has been pushed into its mounting position between the two mounting strips 8 and 9, with the free end of its long L-leg 13 extending to the bottom of mounting groove 10, spring element 18 which is supported at the interior face of rear mounting strip 8 urges mounting bracket 3 against the interior face 22 of front mounting strip 9, and the two retaining lugs 25 are pushed into longitudinal groove 23. In this mounted position, every mounting bracket 3 can be displaced vertically and adjusted in height with respect to the system housing.

Spring element 18 retains mounting bracket 3 in mounting groove 10. Mounting bracket 3 may be displaced manually or also removed again by way of a slight pivoting movement. With the aid of four fastening screws 14, the front plate 6 of a component carrier can be screwed to four mounting brackets 3 which are pushed into the two facing profiled fastening members 1 and 2. Before fastening screws 14 are tightened, it is possible to still make a fine vertical adjustment.

At their respective front mounting strips 9, the two profiled fastening members 1 and 2 are provided with a contact shoulder 27 against which the side edges 28 of front plate 6 lie once they are fastened. The height of contact shoulder 27 corresponds to the thickness of front plate 6.

In addition to fastening threads 7, a plurality of low ribs 29 having a triangular profile are provided at the frontal face 21 of the long leg 13 of mounting bracket 3. These ribs 29 are placed closely together and parallel to one another and lie transversely to the longitudinal extent of the long L-leg 13.

At the rear faces of profiled fastening members 1 and 2 facing toward the interior of the system housing, in the region of the rear mounting strips 8, an L-rail 30 is shaped which forms the bottom of T-shaped groove 11 and extends over the entire length of profiled fastening members 1 and 2. Two additional parallel mounting strips 31 and 32, which likewise form a mounting groove 33 between themselves and are provided with a longitudinal groove 34 for engagement of the retaining lugs 25 of a mounting bracket 3, are attached to this L-rail 30.

In order to increase their bending strength and to reduce the weight, the two profiled fastening members 1 and 2 are provided with a continuous longitudinal opening 35 which has a circular cross section.

It will be understood that the above description of the present invention is susceptible to various modifications, changes and adaptations, and the same are intended to be comprehended within the meaning and range of equivalents of the appended claims.

What is claimed is:

1. A fastening device for component carriers in system housings, the system housings having two vertical front frame bars, an interior, and an opening into the interior, the device including
    profiled fastening members to be attached to the two vertical front frame bars of the system housings; and
    height adjustable carrier elements to be fastened to the profiled fastening members and provided with a fastening thread for screwing on the component carriers that are equipped with front plates,
  characterized in that
    the profiled fastening members are each provided with two parallel mounting strips, namely a rear mounting strip adjacent to the interior of the system housing and a front mounting strip having a base and an interior face near the opening of the system housing;
    the mounting strips form a mounting groove having an essentially rectangular cross section;
    the mounting strips of the profiled fastening members face one another;
    the carrier elements are mounting brackets having a frontal face and a back and which have an L-shaped cross section composed of a short L-leg and a long L-leg, said long L-leg having a free end;
    the short L-leg of the mounting bracket forms a contact strip for the front plate of the component carriers;
    the free length of the short L-leg coincides with the thickness of the front mounting strip;
    in addition to the fastening thread, the back of the mounting bracket carries a spread-away spring element;
    a longitudinal guide in the form of a longitudinal groove as well as at least one retaining lug engaging in said longitudinal groove are formed between the frontal face of the mounting bracket and the interior face of the front mounting strip;
    if the spring element is depressed, the mounting bracket can be pushed form the side into the mounting groove and between the two mounting strips, with the retaining lug, in a pushed-in mounted position, engaging in the longitudinal groove.

2. A fastening device according to claim 1, characterized in that the longitudinal groove is provided at the base of the front mounting strip and the retaining lug engaging in the longitudinal groove is attached to the free end of the long L-leg of the mounting bracket.

3. A fastening device according to claim 1, characterized in that the front mounting strip includes a contact shoulder for a vertical side edge of the front plate of the component carrier.

4. A fastening device according to claim 1, characterized in that the spring element is configured as a leaf spring.

5. A fastening device according to claim 4, characterized in that one end of the leaf spring is the free end of the long L-leg of the mounting bracket and extends in the direction toward the fastening thread.

6. A fastening device according to claim 1, characterized in that the profiled fastening members carry two additional parallel mounting strips each having a base which likewise form an additional mounting groove having a rectangular cross section and one of said additional mounting strips is provided with an additional longitudinal groove in its base for the engagement of the retaining lug of a mounting bracket.

7. A fastening device according to claim 6, characterized in that the additional mounting strips are attached to an L-rail which is attached to the profiled fastening members in the region of the rear mounting strip.

* * * * *